US012732199B2

(12) United States Patent
Kota et al.

(10) Patent No.: US 12,732,199 B2
(45) Date of Patent: Sep. 8, 2026

(54) REDUCING NON-LINEARITY IN A DIGITAL-TO-TIME CONVERTER (DTC) WHEN AN INPUT CLOCK CHANGES BETWEEN LOWER AND HIGHER PERIODS

(71) Applicant: Shaoxing Yuanfang Semiconductor Co., Ltd., Shaoxing (CN)

(72) Inventors: Venkata Kalyan Kumar Kota, Bangalore (IN); Augusto Manuel Marques, Norwich (GB); Rakesh Kumar Gupta, Bangalore (IN); Raja Prabhu J, Bangalore (IN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 169 days.

(21) Appl. No.: 18/829,350

(22) Filed: Sep. 10, 2024

(65) Prior Publication Data

US 2025/0323652 A1 Oct. 16, 2025

(51) Int. Cl.

*H03L 7/197* (2006.01)
*H03M 1/74* (2006.01)
*H03M 3/00* (2006.01)
*H04L 7/033* (2006.01)

(52) U.S. Cl.

CPC .......... *H03L 7/1976* (2013.01); *H03M 1/745* (2013.01); *H03M 3/358* (2013.01); *H03M 3/50* (2013.01); *H04L 7/0331* (2013.01)

(58) Field of Classification Search

CPC .... H03L 7/1974; H03L 7/1976; H03M 1/745; H03M 3/358; H03M 3/50; H04L 7/0331

See application file for complete search history.

(56) References Cited

U.S. PATENT DOCUMENTS 10,530,368 B1 * 1/2020 Caffee .................... H03K 23/66
11,018,688 B1 5/2021 Guo et al.
11,923,857 B1 3/2024 Zhang et al.

OTHER PUBLICATIONS

Wanghua Wu, A 28-nm 75-fsrms Analog Fractional-N Sampling PLL With a Highly Linear DTC Incorporating Background DTC Gain Calibration and Reference Clock Duty Cycle Correction, 2019, 12 Pages, IEEE Journal of Solid-State Circuits.

(Continued)

*Primary Examiner* — Menatoallah Youssef
*Assistant Examiner* — Colleen J O Toole
(74) *Attorney, Agent, or Firm* — IPHORIZONS PLLC; Narendra Reddy Thappeta

(57) ABSTRACT

A digital-to-time converter (DTC) is used to generate code dependent delays in fractional clock dividers by generating a fractional output clock, corresponding to a reference signal, from a divided signal having different time periods for obtaining the fractional output clock. The DTC contains an input buffer coupled to receive the divided signal and to generate an intermediate output, wherein the current drawn from a power supply contains a first average current magnitude when the divided signal has a lower time period, and a second average current magnitude when the divided signal has a higher time period. A correction-component compensates for the difference of the first average current magnitude and the second average current magnitude to improve linearity of the DTC.

20 Claims, 9 Drawing Sheets

(56) References Cited

OTHER PUBLICATIONS

Salvatore Levantino, An Adaptive Pre-Distortion Technique to Mitigate the DTC Nonlinearity in Digital PLLs, Aug. 2014, 11 Pages, vol. 49—Issue No. 8, IEEE Journal of Solid-State Circuits.
Nereo Markulic, A DTC-Based Subsampling PLL Capable of Self-Calibrated Fractional Synthesis and Two-Point Modulation, 2016, 15 Pages, IEEE Journal of Solid-State Circuits.
Hanli Liu, A Sub-mW Fractional-N ADPLL With FOM of −246 dB for IoT Applications, Dec. 2018, 13 Pages, vol. 53—Issue No. 12, IEEE Journal of Solid-State Circuits.
Salvatore Levantino, Nonlinearity Cancellation in Digital PLLs, 2013, 8 Pages, IEEE.
Jiayoon Zhiyu Ru, A High-Linearity Digital-to-Time Converter Technique: Constant-Slope Charging, Jun. 2015, 12 Pages, vol. 50—Issue No. 6, IEEE Journal of Solid-State Circuits.
Eslam Helal, DTC Linearization via Mismatch-Noise Cancellation for Digital Fractional-N PLLs, Dec. 2022, 14 Pages, vol. 69—Issue No. 12, IEEE Transactions on Circuits and Systems—I: Regular Papers.
Peng Chen, A 31-μW, 148-fs Step, 9-bit Capacitor-DAC-Based Constant-Slope Digital-to-Time Converter in 28-nm CMOS, Sep. 2019, 11 Pages, IEEE Journal of Solid-State Circuits.

* cited by examiner

REDUCING NON-LINEARITY IN A DIGITAL-TO-TIME CONVERTER (DTC) WHEN AN INPUT CLOCK CHANGES BETWEEN LOWER AND HIGHER PERIODS

PRIORITY CLAIM

The instant patent application is related to and claims priority from the co-pending India provisional patent application entitled, "Dtc Non-Linearity Suppression Methods", Serial No.: 202441029799, Filed: 12 Apr. 2024, which is incorporated in its entirety herewith to the extent not inconsistent with the description herein.

BACKGROUND

Technical Field

Embodiments of the present disclosure relate generally to digital-to-time converters (DTCs), and more specifically to reducing non-linearity in a DTC when an input clock changes between lower and higher periods.

Related Art

Digital-to-time converters (DTCs) are generally used to generate an output signal having a corresponding edge delayed from that of an input clock signal by a magnitude specified by an input digital code. DTCs find use in electronic devices such as fractional-N phase locked loops (PLLs), sampling oscilloscopes, direct digital frequency synthesis, etc., as is well known in the relevant arts.

The ideal transfer function for a DTC is a straight line, implying that the time delay changes linearly with corresponding changes in values of the digital code. However, in certain real-world scenarios, the actual output delay may deviate from the ideal value, which is termed as non-linearity in the operation of the DTC. Such non-linearity may be unacceptable at least in some environments.

There are often scenarios when an input clock to a DTC changes between lower and higher periods. For example, when a DTC is used in a fractional-N PLL, the input clock is generated with different periods in the process of generating a PLL output having a fractional frequency of a PLL input clock signal. The inventors have observed certain non-linearity in the operation of a DTC in such scenarios.

Aspects of the present disclosure are directed to reducing non-linearity in a digital-to-time converter (DTC) when an input clock changes between lower and higher periods.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
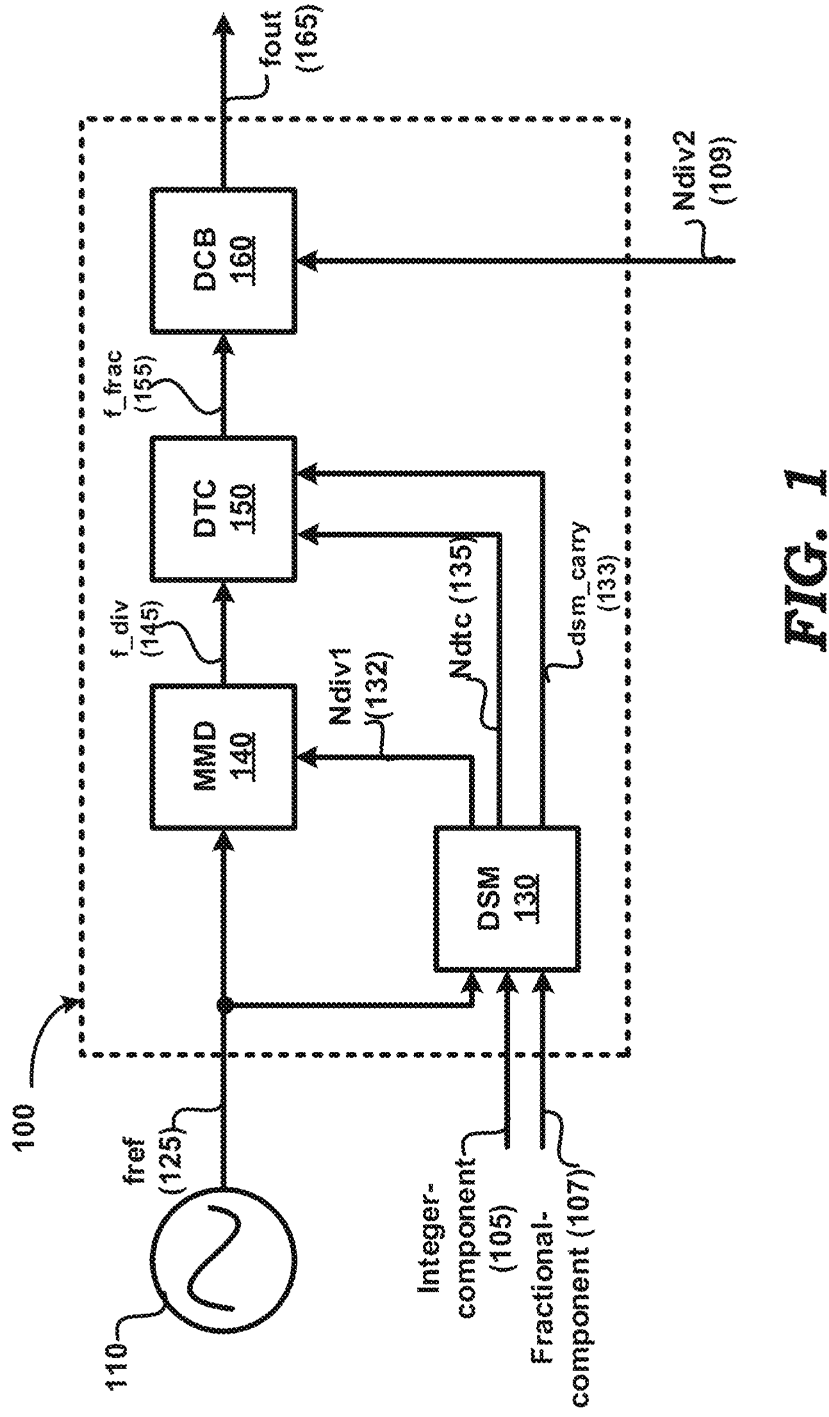
FIG. 1 is a block diagram of an example device in which several aspects of the present disclosure can be implemented.

An aspect of the present disclosure is directed to an open-loop modulator (OLM) circuit for generating a fractional output clock having a frequency which is a desired fraction of that of a reference clock, wherein the desired fraction comprises an integer component and a fractional component. In an embodiment, the OLM contains a delta-sigma modulator (DSM) coupled to receive the desired fraction and to generate a sequence of first codes and a corresponding sequence of second codes, wherein the sequence of first codes contains a set of a lower value and a set of a higher value together representing the desired fraction on average. A first divider generates a divided signal with a period that is a multiple of the period of the reference clock, wherein the multiple is the first code, such that the divided signal has different periods corresponding to the lower value and the higher value.

A digital-to-time converter (DTC) generates the fractional output clock from the divided signal, with the DTC containing an input buffer coupled to receive the divided signal and to generate an intermediate output, wherein the current drawn from a power supply contains a first average current magnitude when the first code contains the lower value, and a second average current magnitude when the first code contains a higher value. A delay generator delays the intermediate output according to corresponding second code of the sequence of second codes to generate the fractional output clock.

A correction-component compensates for the difference of the first current magnitude and the second current magnitude to improve linearity of the DTC.

In an embodiment, the DSM is designed to indicate occurrence of higher values for the first code using a bit at a specified logic level, wherein the correction-component draws a first current from the power supply when the bit equals the specified logic level to compensate for the difference in the magnitude between the first average current magnitude and the second average current magnitude. The correction-component may be implemented in the form of a digital-to-analog converter (DAC) to draw the first current from the power supply.

According to another aspect, the magnitude of the first current is configured so as to substantially render equal the magnitude of average currents drawn in lower and higher periods of the divided signal to improve linearity of the DTC.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

FIG. 1 is a diagram illustrating the details of an example device in which several aspects of the present disclosure can be implemented. FIG. 1 depicts an open-loop-modulator (OLM) 100 (also known as Open Loop Fractional Divider or Fractional Frequency Divider) implemented according to aspects of the present disclosure. OLM 100 generates output clock fout on path 165 from reference clock fref received on path 125, and is shown containing delta-sigma modulator (DSM) 130, multi-modulus divider (MMD) 140, digital-to-time converter (DTC) 150 and duty cycle block (DCB) 160. It is noted herein that only components as relevant to the understanding of the disclosure are depicted in FIG. 1. It is understood that OLM 100 can contain more or fewer blocks than those shown in FIG. 1.

Reference clock fref (125) may be generated by a phase-locked loop (PLL), oscillator, etc. In an embodiment, PLL 110 generates reference clock fref (125) and can be implemented in a known way.

DSM 130 receives a desired 'fraction' ('divide value') in the form of integer-component 105 and fractional-component 107, and generates a sequence of correlated code pairs on Ndiv1 132 and Ndtc 135, in a known way. The first value of the pair is an integer and the second value of the pair indicates a desired delay, which in combination realizes the desired fractional output clock on fout 165. As an example, for a fraction 4.25 containing integer component of '4' and fractional component of '0.25, a (repetitive) sequence of digits 4, 4, 4, and 5 (averaging 4.25) are sent on Ndiv1 (132), while a sequence of delay values ¼, ²⁄₄, ¾ and 0 are sent on Ndtc (135). As described below, fout 165 (f_frac 155) is generated with a period of 4.25 times that of fref 125. dsm_carry 133 is at 1 when the higher values (5) are transmitted on Ndiv1 132 and at 0 otherwise. In an embodiment, DSM 130 is a first-order delta-sigma modulator. Although the illustrative embodiment depicts a first-order delta-sigma modulator, aspects of the present disclosure are equally applicable to delta-sigma modulators of higher order, as will be apparent to a skilled practitioner by reading the disclosure herein. DSM 130 can be implemented in a known way.

MMD 140 receives reference clock fref on path 125 and code Ndiv1 on path 132, and generates divided clock f_div on path 145 according to each received code Ndiv1 (132). Code Ndiv1 (132) contains lower values (4 in the above example) and higher values (5) resulting in corresponding lower and higher time periods of f_div (145) such that the average period of f_div (145) equals the time period of desired fractional clock. MMD 140 can be implemented in a known way.

DTC 150 delays each falling (or rising) edge of divided clock f_div on path 145 by a magnitude represented by corresponding Ndtc code received on path 135 to generate fractional output clock f_frac on path 155. DTC 150 is also shown receiving dsm_carry on path 133 according to aspects of the present disclosure, the use of which will be explained in detail with respect to FIGS. 4 and 5.

Duty Cycle Block (DCB) 160 generates output clock fout on path 165 with a desired duty cycle corresponding to clock f_frac received on path 155. In an embodiment, DCB 160 operates as a divider block that divides frequency of f_frac (155) by an even number for obtaining the 50% duty cycle, and integer-component (105) and fractional-component (107) are accordingly scaled down. DCB 160 can be implemented in a known way.

Figure 2:
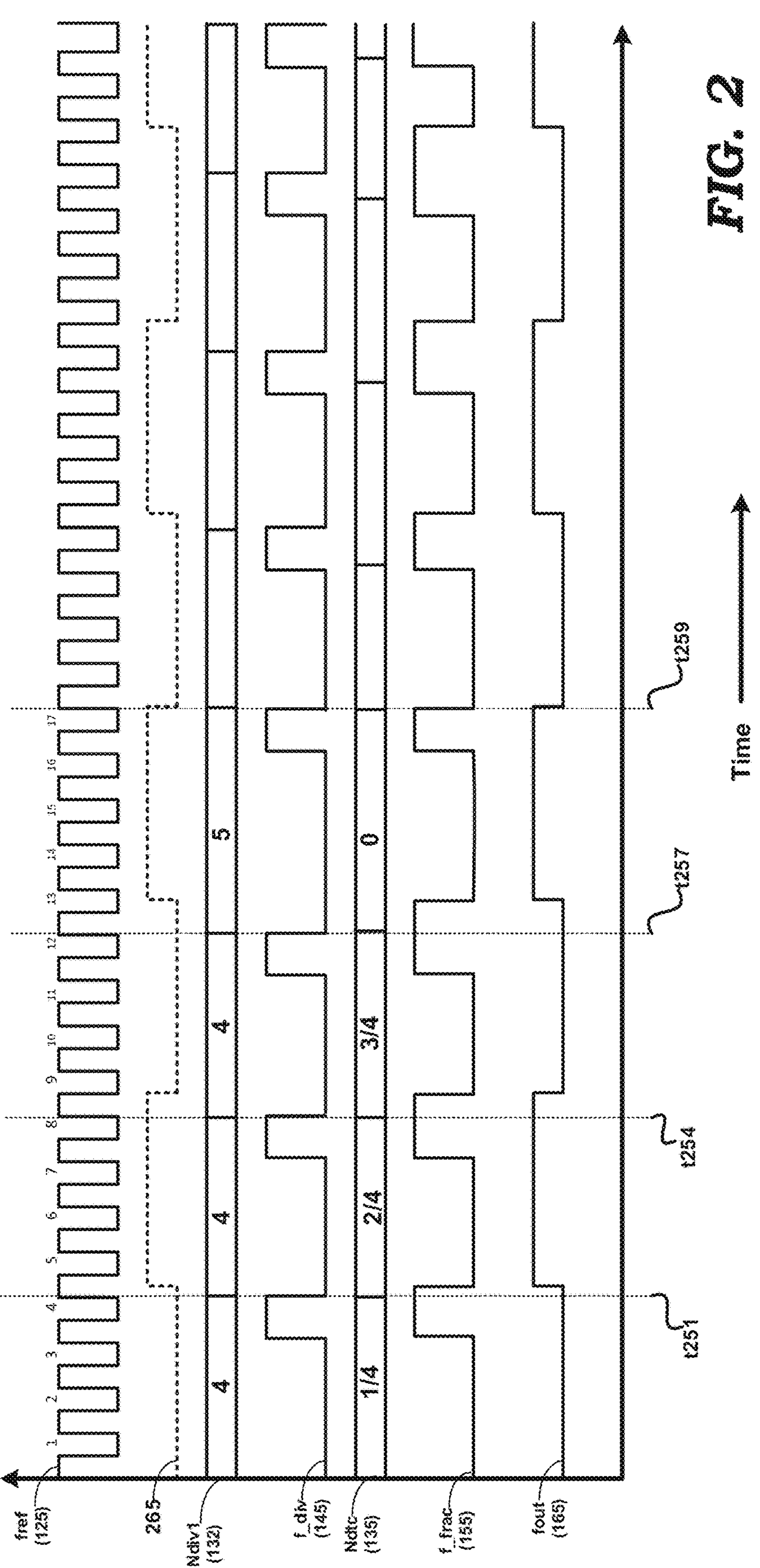
FIG. 2 is a timing diagram (not to scale) illustrating waveforms generated at various nodes of an open-loop-modulator (OLM).

FIG. 2 is a timing diagram (not to scale) illustrating waveforms generated at various nodes of OLM 100 assuming a fraction of 8.5 and that DCB 160 is designed to divide by 2. Thus, Ndiv1 132 is shown with a divisor equal to individual codes of repetitive sequence 4, 4, 4 and 5 respectively, and Ndtc 135 is shown with correlated codes of ¼, ²⁄₄, ¾ and 0. f_div 145 represents the corresponding divided clock generated by dividing fref (125) with the codes received on Ndiv1 (132), with time period of f_div (145) corresponding to Ndiv1 (132) codes as depicted at time instances t251, t254, t257 and t259. f_frac (155) depicts the falling edges of f_div (145) delayed by a magnitude specified by Ndtc 135. fout 165 depicts the desired output signal with 50% duty cycle, obtained by dividing frequency of f_frac (155) by 2.

It may be appreciated that the input clock (i.e., f_div 145) to DTC 150 has a time period that changes between lower and higher values based on values of Ndiv1 (132), which may contribute to non-linear behavior of DTC 150, as will be explained next with reference to implementation of a prior DTC. Accordingly, an example prior DTC is briefly described next with reference to FIGS. 3A-3C.

3. Prior DTC

Figure 3A:
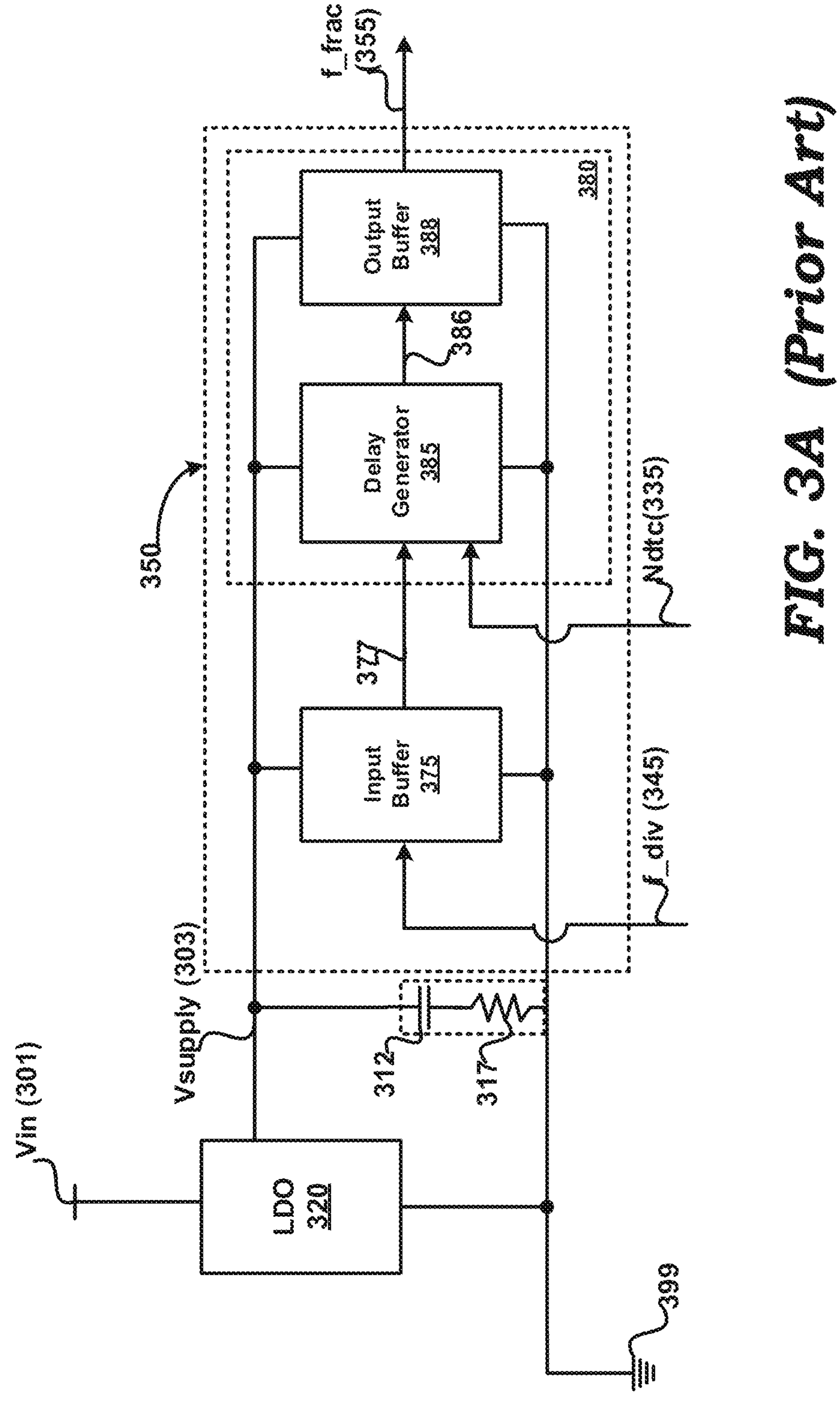
FIG. 3A is a block diagram illustrating the implementation details of a prior digital-to-time converter (DTC).

FIG. 3A is a logical view of a prior DTC 350 along with associated power supply 320 illustrating a problem with that implementation. FIG. 3A is shown containing low-dropout voltage regulator (LDO) 320 supplying regulated voltage Vsupply (303) of a desired magnitude (hereinafter referred to as 'nominal magnitude') to prior DTC 350 from an input voltage Vin (301). Also shown in FIG. 3A are decoupling capacitor 312 and equivalent series resistance 317, associated with LDO 320. Node 399 represents ground providing constant reference potential.

DTC 350 is shown containing input buffer 375, delay generator 385 and output buffer 388. Delay generator 385 and output buffer 388 may together be viewed as 'delay control block' 380 designed to generate the desired fractional output clock.

Input buffer 375 generates high strength clock (full logic level digital signal) on path 377 from divided clock f_div received on path 345 for use within delay generator block 385. Thus, the frequency of output clock (377) of input buffer 375 with respect to clock f_div (345) remains unvaried.

Delay generator 385 generates the fractional output clock on path 386, which is delayed version of f_div 345 (equivalent of f-div 145 of FIG. 1), with the delays (of corresponding edges of f_div 345) being specified by the values of code Ndtc received on path 335. Output buffer 388 generates high strength fractional output clock on path f_frac (355) from fractional output clock received on path 386. The implementation details of blocks 375, 385 and 388 are described next with respect to FIG. 3B.

Figure 3B:
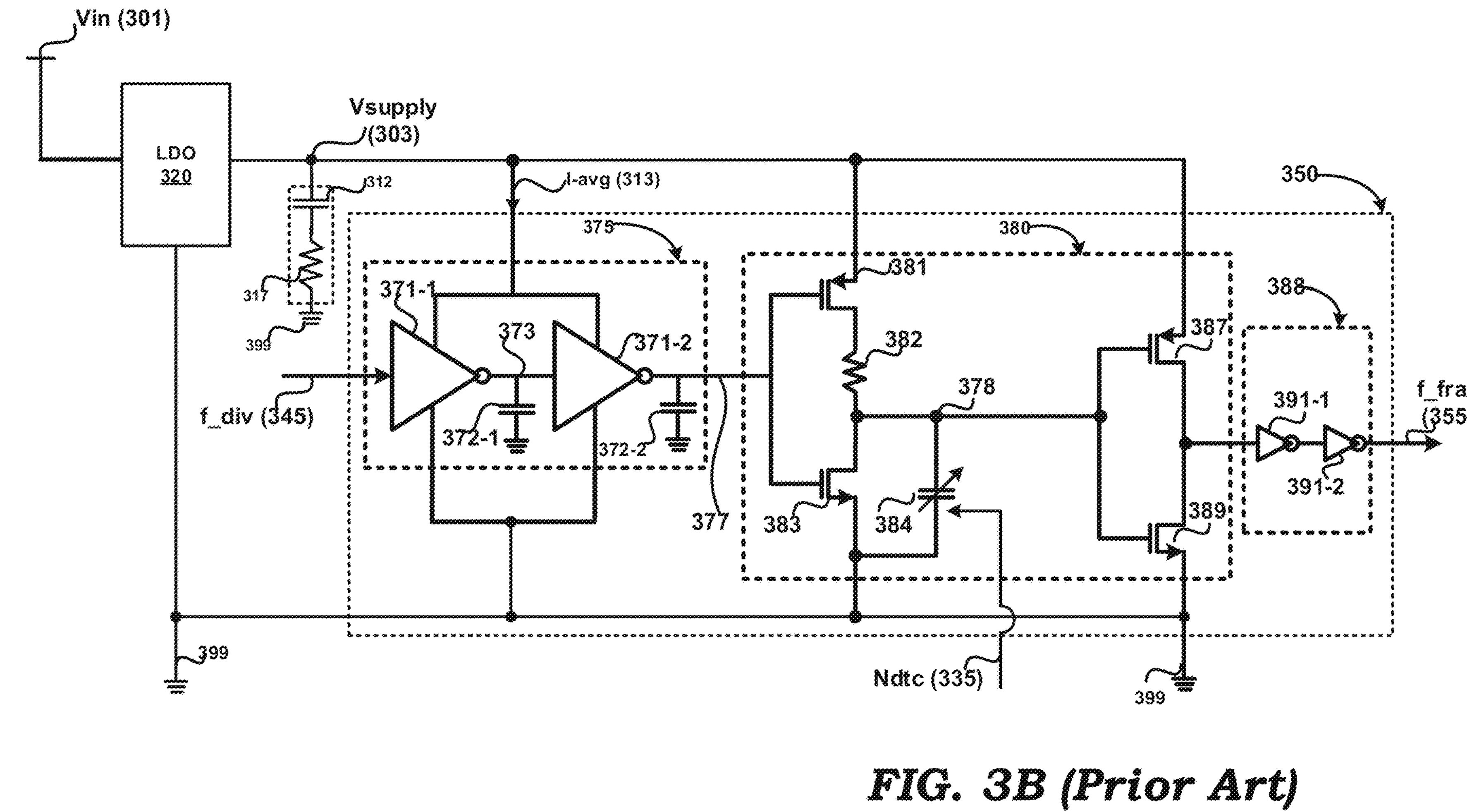
FIG. 3B is a block diagram illustrating further details of the prior DTC.

FIG. 3B depicts implementation details of prior DTC 350. Specifically, input buffer 375 is shown containing complementary metal-oxide semiconductor (CMOS) inverters 371-1, 371-2 along with associated respective load capacitors 372-1 and 372-2.

Delay control block 380 is shown containing an inverter (comprising transistors 381 and 383), a controllable load (comprising resistor 382 and capacitor bank 384) and a comparator (implemented as CMOS inverter containing transistors 387 and 389) to realize the specified delay (corresponding to code Ndtc received on path 335) for falling edges of clock f_div (345).

As is well known in the relevant arts, one of the capacitors in capacitor bank 384 is selected based on code Ndtc (335), and the RC time-constant of the RC circuit constituted of resistor R (382) and selected capacitor (384) determines the slope of rising edge of clock signal at node 378. The threshold of comparator (comprising transistors 387 and 389) is configured to provide the desired delay in conjunction with the slope.

Thus, the RC circuit generates an exponential ramp with a fixed value of R and a code-controlled value of C, while the threshold comparison of comparator defines a decision threshold and produces an output edge (of fractional clock) when crossing the threshold, as is also well known in the relevant arts. Output buffer 388 is shown containing inverters 391-1 and 392-2.

Referring to input buffer 375, when an input transition occurs in clock f_div (345), a corresponding transient current flows in order to charge or discharge load capacitors 372-1/372-2. For example, when a low-to-high transition (rising edge) occurs in clock f_div (345), a corresponding high-to-low transition occurs at node 373, thus discharging load capacitor 372-1 to ground 399, while a low-to-high transition occurs at node 377, thus charging load capacitor 372-2.

On the other hand, when a high-to-low transition (falling edge) occurs in clock f_div (345), a corresponding low-to-high transition occurs at node 373, thus charging load capacitor 372-1 (while a high-to-low transition occurs at node 377, thus discharging load capacitor 372-2). The charging current of load capacitors 372-1/372-2 flows from decoupling capacitor 312 associated with LDO 320, resulting in a corresponding dip in magnitude of voltage Vsupply at node 303. Subsequent to the processing of each edge of f_div (345), decoupling capacitor 312 charges from Vin (301) in order to restore Vsupply (303) to the nominal magnitude.

Since the capacitance value of capacitor 372-2 is higher than that of capacitor 372-1 (due to, for example, track length from output of block 375 to input of block 380 and/or due to the stronger drive of 371-2), charging of capacitor 372-2 (corresponding to rising edges of clock f_div (345)) will result in larger dip in magnitude of Vsupply (303) than charging of capacitor 372-1 (corresponding to falling edges of clock f_div (345)).

The charging current of capacitors 372-1 and 372-2 may cause corresponding dips and rises in magnitude of voltage Vsupply at node 303, and therefore ripple in Vsupply (303).

Under steady-state conditions (i.e., after the circuit settles in a short time after being powered on), when period (frequency) of f_div (345) is constant, average magnitude of Vsupply (303) would settle to within an acceptable deviation (from the nominal magnitude) due to control-loop correction of LDO 320. Accordingly, magnitude of supply voltage (Vsupply) available to input buffer (375) at node 303 at the occurrences of falling edges of f_div (345) would remain (substantially) constant under steady-state conditions when period (frequency) of f_div (345) is constant.

Figure 3C:
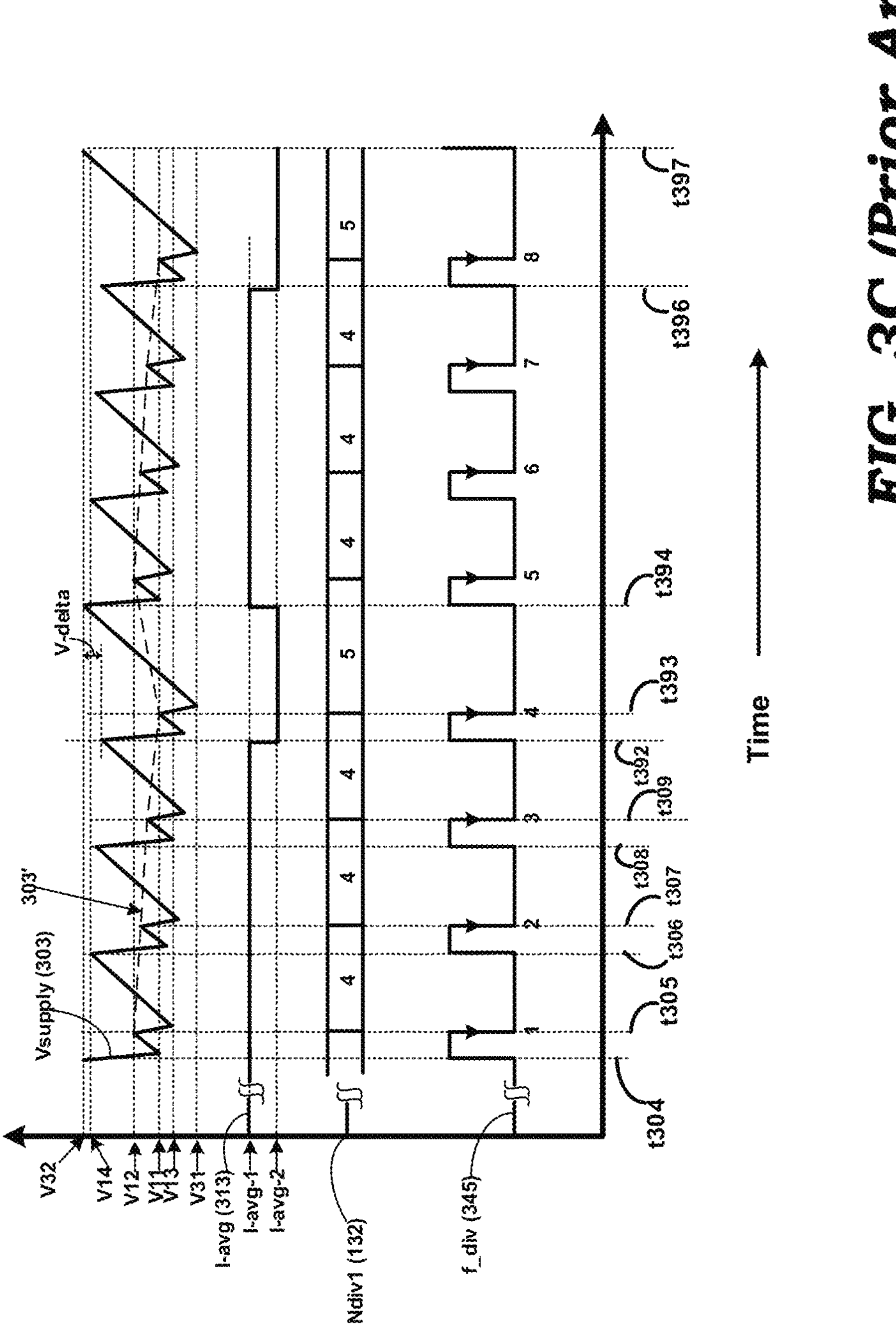
FIG. 3C is a timing diagram (not to scale) depicting the ripple in power supply voltage in the prior DTC.

However, when the period of f_div (345) is varying (such as in the case of DTCs used in fractional-N PLLs), the ripple in Vsupply (303) leads to non-linear behavior of DTC 350, as explained in detail with respect to FIG. 3C.

FIG. 3C is a timing diagram (not to scale) illustrating ripple in power supply during steady-state operation of prior DTC 350, and depicts waveforms/values Vsupply (303), Ndiv1 (132), f_div (345) and I-avg (313). Decimal values of code Ndiv1 (132) are shown for ease of understanding. Referring to the example fraction of 4.25 noted above, Ndiv1 (132) codes are as shown in FIG. 3C. Clock periods of f_div (345) are shown numbered 1 to 8 for ease of understanding. Thus, clock period 1 is shown starting at t304 and ending at t306, and so on.

It is noted herein that although FIG. 3A depicts LDO 320 as supplying regulated voltage to blocks 375 and 380, waveforms of FIG. 3C depict power supply ripple only due to input buffer 375, for the sake of simplicity. Thus, I-avg (313) represents the average current drawn from LDO 320 due to the operation of input buffer 375 only.

In steady-state operation, shape of waveform of Vsupply (303) is shown repeating every 4 clock periods of f_div (345). In other words, due to control-loop correction of LDO 320, the magnitude of Vsupply (303) is restored to V32 at every fifth rising edge of f_div (345) (time instants t304, t306 and t392). The nominal magnitude of Vsupply (303) is around a value mid-way between V31 and V32 under steady-state conditions.

Referring to the first clock period (time interval t304-t306) of f_div (345), as part of processing of the rising edge by input buffer 375, decoupling capacitor 312 discharges to voltage V11 and charges to voltage V12. As part of processing of the falling edge by input buffer 375, decoupling capacitor 312 discharges to voltage V13 and charges to voltage V14. Dip (V32 minus V11) while processing the rising edge of f_div (345) is larger than dip (V12 minus V13) while processing the falling edge of f_div (345) due to different capacitance values of 372-1 and 372-2 as noted above. LDO 320 is unable to restore magnitude of Vsupply (303) to V32 (from V13) due to limited bandwidth of LDO 320, with the bandwidth being lesser than the frequency of signal f_div (345) when Ndiv1 (132) equals 4.

Since the magnitude of supply voltage Vsupply (303) just prior to processing of each rising edge of clock f_div (345) is successively lesser than that of the previous period of f_div (345), the magnitude of Vsupply (303) after processing each pair of edges (one rising edge and the corresponding falling edge) in respective periods of f_div (345) also gradually decreases with time, as depicted in time intervals t306-t308, t308-t392.

As noted above, had the period of clock f_div (345) been constant, average value of Vsupply (303) would have settled to a substantially constant value (around a value mid-way between V31 and V32) under steady-state conditions.

However, due to a higher period (t392-t394) of f_div (345) (corresponding to 5 clock cycles of fref (125)), decoupling capacitor 312 charges to V32 (higher in magnitude compared to previous Vsupply (303) value at t392, the difference in magnitudes indicated by V-delta in FIG. 3C). Thus, the magnitude of supply voltage Vsupply (303) available for inverters 371-1 and 371-2 at occurrences of falling edges (t305, t307, t309 and t393) varies in each clock period of f_div (345), as shown by dotted waveform 303'.

In other words, for higher periods (corresponding to period t392-394 and t396-t397) of f_div (345), the magnitude of average current (depicted as magnitude I-avg−1 in FIG. 3C) drawn by input buffer 375 is lesser than the magnitude of average current (depicted as magnitude I-avg-1 in FIG. 3C) drawn by input buffer 375 for lower periods (corresponding to periods t304-t306, t306-t308, t308-t392 and so on) of f_div (345).

The propagation delay of inverters 371-1 and 371-2 (in input buffer 375) depends inversely on supply voltage Vsupply (303), as is well known in the relevant arts. Accordingly, due to the difference in magnitude of Vsupply (303) for falling edges occurring at t305, t307, t309 and t393, the corresponding propagation delays are different.

Such difference in propagation delays introduced by input buffer 375 results in jitter in clock signal 377. Since delay control block 380 operates to delay the falling edges of signal 377, such jitter in (input) signal 377 will propagate to signal f_frac (355) if left uncorrected. In other words, errors in delays by DTC 350 vary between cycles corresponding to a same/different fraction, resulting in non-linear behavior of prior DTC 350.

In addition, the magnitude of non-linearity depends on the fraction being realized. For example, non-linearity may be different (for example, greater) for a fraction of 6.25 as compared to a fraction of 6.5, since the corresponding Ndiv1 codes for fraction 6.25 would be a (repetitive) sequence of digits 6, 6, 6, 7, while that for fraction 6.5 would be 6, 7.

A DTC implemented according to aspects of the present disclosure reduces such non-linearity, as described next.

4. Digital-to-Time Converter (DTC)

Figure 4:
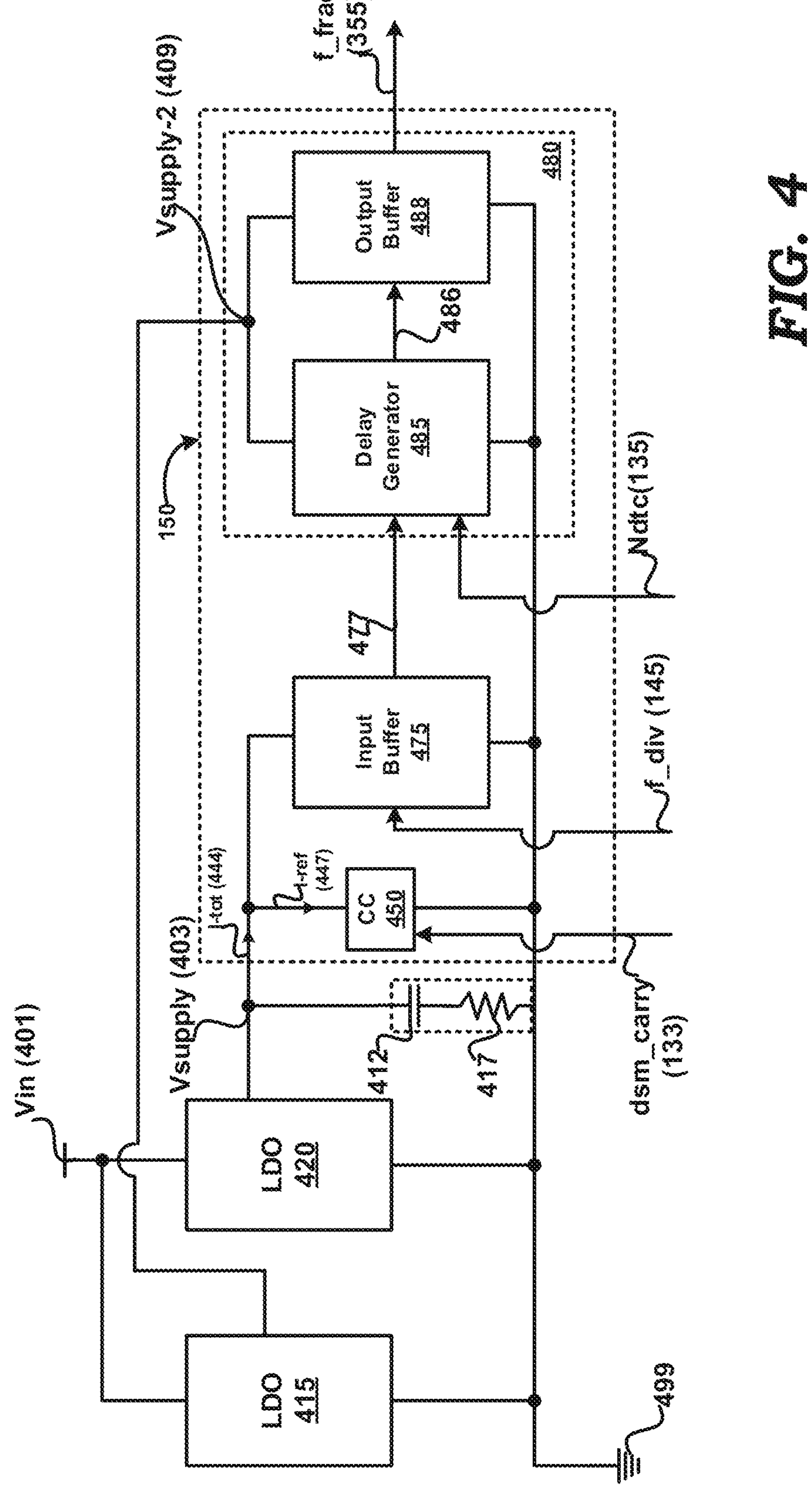
FIG. 4 is a diagram illustrating the implementation details of a DTC, in an embodiment of the present disclosure.

FIG. 4 is a diagram illustrating the logical view of a DTC, along with associated power supplies LDO 415 and LDO 420, in an embodiment of the present disclosure. DTC 150 in turn is shown containing correction-component (CC) 450, input buffer 475 and delay control block 480 (comprising delay generator 485 and output buffer 488). Also shown in FIG. 4 are decoupling capacitor 412 and equivalent series resistance 417, associated with LDO 420. Node 499 represents ground providing constant reference potential.

Blocks 475, 485 and 488 are functionally equivalent to blocks 375, 385 and 388 respectively of FIG. 3A, and their description is not repeated here in the interest of brevity. Also, signals 477 and 486 are functionally equivalent to signals 377 and 386 respectively of FIG. 3A, and their description is not repeated here, also in the interest of brevity.

LDO 415 operates to provide regulated supply voltage Vsupply-2 (409) from input voltage Vin received on path 401. LDO 420 operates to provide regulated supply voltage Vsupply (403) from input voltage Vin (401). Voltage Vin (401) represents a DC voltage source providing input voltage to LDOs 415/420.

Also, although the illustrative embodiment depicts power supply 420 implemented as an LDO, aspects of the present disclosure are equally applicable to any linear or switching voltage regulator supplying regulated voltage on path 403, as will be apparent to a skilled practitioner upon reading the disclosure herein.

CC 450 operates to compensate for the difference in magnitude of average currents drawn from power supply 420 by input buffer 475 in lower and higher time periods of input clock (f_div, 145). In other words, CC 450 operates so as to substantially render equal the magnitude of average currents drawn from LDO 420 in lower and higher periods of f_div (145). CC 450 is shown receiving dsm_carry bit on path 133.

In an embodiment, CC 450 draws (sinks) current I-ref (447) from LDO 420 only in the higher time period (when dsm_carry bit (133) is generated by DSM 130) to compensate for the above noted difference in current magnitudes, and does not draw any current from LDO 420 otherwise. The magnitude of I-ref (447) is configured such that the magnitude of the average current I-tot (444) drawn from LDO 420 remains substantially the same for lower and higher periods of f_div (145). The average magnitude is represented as I-avg in FIG. 6.

It is noted herein that even if a single LDO were to be employed to provide regulated voltage to blocks 475 and 480, CC 450 would operate to minimize non-linearity contributed by input buffer 475 in comparison with prior art (FIG. 3A). Separate LDOs provide an added benefit of further reducing non-linearity caused due to additional contribution by delay control block 480.

The implementation details of CC 450 in an embodiment of the present disclosure are provided next.

5. Correction-Component

Figure 5:
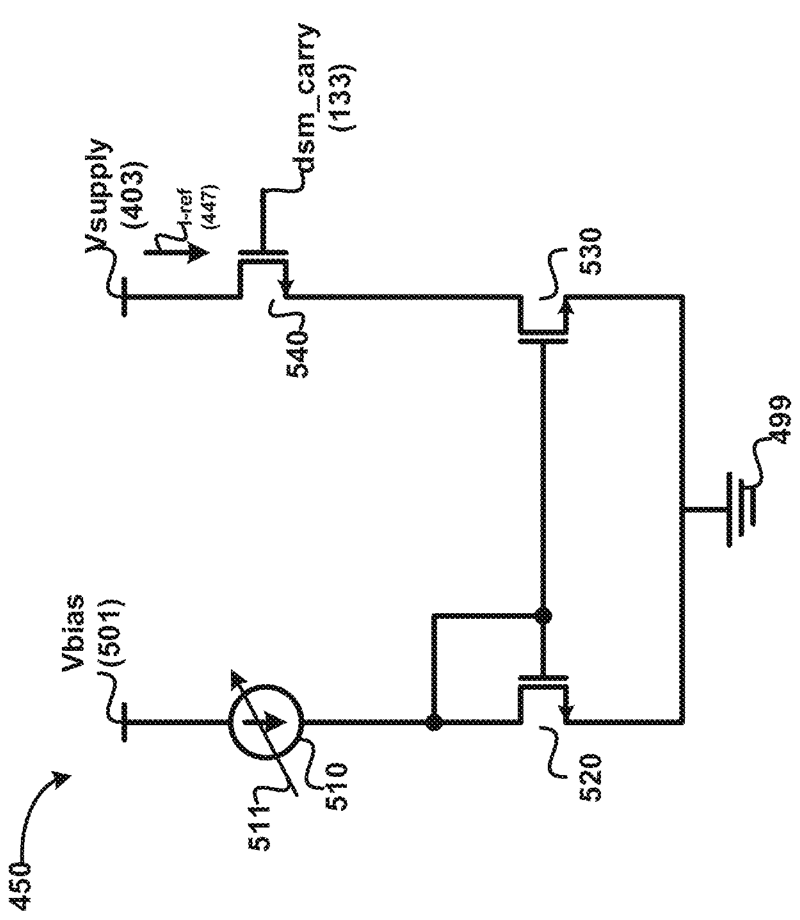
FIG. 5 is a diagram illustrating the implementation details of a correction-component, in an embodiment of the present disclosure.

FIG. 5 is a diagram illustrating the implementation details of CC 450 in an embodiment of the present disclosure. CC 450 is shown implemented as digital-to-analog converter (DAC) containing MOSFET (Metal Oxide Semiconductor Field Effect Transistor) transistors 520, 530, 540, and controlled current source 510.

Transistors 520 and 530 together form a current-mirror. Transistors 520 and 530 may be matched transistors with similar characteristics. The magnitude of current sourced by current source 510 is controlled by configuration-input (511), and is configured so as to substantially render equal the magnitude of average currents drawn in lower and higher periods of f_div (145). Such configuration of current source 510 is designed for: (i) a certain operating frequency range of f_frac (155), and (ii) a certain range of desired fraction, as will be described below in detail. Vbias (501) represents bias voltage for the current-mirror circuit, and may be generated internal to OLM 100 by a power supply other than LDO 420.

Gate terminal of transistor 540 is shown connected to dsm_carry (133). Transistor 540 acts as a switch, and operates to draw (sink) current of magnitude I-ref (447) (which is equal in magnitude to current provided by current source 510 by operation of current-mirror) from Vsupply (403) based on logic level of dsm_carry bit (133).

In an embodiment, when dsm_carry bit (133) is asserted, transistor 540 is turned on and begins to draw (sink) current of magnitude I-ref (447). When dsm_carry (133) is de-asserted, transistor 540 is turned off, thereby stopping the sinking of current from Vsupply (403) by DAC 450. Thus, CC 450 draws current for the period when dsm_carry bit (133) is logic high, which corresponds to the time period of clock fref (125) by operation of accumulator inside DSM 130.

Although correction-component 450 in the illustrative embodiment is shown implemented as a DAC, aspects of the present disclosure can be equally well applied when alternative techniques are employed to sink current from LDO 420, as will be apparent to a skilled practitioner by reading the disclosure herein. For example, different or more complex correction circuits can be employed for compensating the difference in current magnitudes noted above. Also, although the illustrative embodiment depicts first-order DSM, aspects of the present disclosure can be equally well applied to higher-order DSMs with corresponding changes to DTC circuitry, as will be apparent to a skilled practitioner by reading the disclosure herein.

Specifically, lower and higher values of Ndiv1 code (132) for a first-order DSM differ by only 1 bit, and accordingly a single bit (dsm_carry, 133 in the illustrative embodiment) is sufficient for controlling DAC 450. However, for higher-order DSMs, lower and higher values of Ndiv1 code (132) may differ by multiple bits, and accordingly multiple DACs (or a current DAC with binary weighted current sources) may be employed with corresponding control inputs generated by DSM 130 with corresponding changes to correction-component circuitry, as will be apparent to a skilled practitioner by reading the disclosure herein.

It is noted herein that the correction-component (CC 450 in the illustrative embodiment) may be enabled/disabled via corresponding switching arrangement (not shown in FIG. 4) with the control of such switch being configured by a user (via corresponding means not shown), in a known way.

The manner in which current source 510 is configured to source current of appropriate magnitude in order to reduce non-linearity in an embodiment of the present disclosure is described next.

6. Configuring Correction-Component

OLM 100 generally needs to be designed to support certain operating frequency ranges of clock f_frac (155), and certain fractions, as is well known in the relevant arts.

In an embodiment, fractions supported by OLM 100 are divided into a set of ranges with the number of ranges in the set being equal to the number of values that can be accommodated in the n-bit configuration-input (to current source 510 of CC 450) across all supported operating frequency ranges of f_frac (155).

For example, assuming that configuration-input (511) to control source 510 is 4 bits wide, one of 16 possible values of I-ref (447) may be configured to be sourced by current source 510, depending on the desired operating frequency range of clock f_frac (155), and the selected fraction.

Specifically, assuming two operating frequency ranges of f_frac (155), and supported values of integer-component (105) being bounded by values 6-32, divide values are divided into 8 ranges such as [6-7], [8-9], [10-12], [13-15], [16-18], [19-22], [23-27] and [28-32]. Thus, a total of 16 possible combinations are available for configuring current source 510.

As noted above, Ndiv1 codes generated on path 132 by a first-order DSM (such as DSM 130 of FIG. 1) vary between a 'lower value' (LV) and a 'higher value' (HV), with HV being 'LV+1'. Accordingly, the frequency of f_div (345) changes between fref (125)/LV and fref (125)/HV, respectively corresponding to lower and higher time periods of f_div (345).

In an embodiment, for each operating frequency range of f_frac (155) supported by OLM 100, for each range in the set of divide value ranges, the lowest divide value (e.g., value of 19 in range [19-22] noted above) is considered as LV and correspondingly, HV equals 'LV+1' (20 in the example). A first average current magnitude drawn from LDO 420 by input buffer 475 for lower periods of f_div (345) is measured by simulating steady-state operation of input buffer 475 with corresponding constant-frequency (fref (125)/19) of f_div (345). Similarly, a second average current magnitude drawn from LDO 420 by input buffer 475 for higher periods of f_div (345) is measured by simulating steady-state operation of input buffer 475 with corresponding constant-frequency (fref (125)/20) of f_div (345). Configuration-input (511) corresponding to the difference between the first average current magnitude and the second average current magnitude, taking into account process corners of the integrated circuit (IC), is stored in a look-up table (LUT) for a combination of a particular operating frequency range of clock f_frac (155) and a range of values of integer-component (105).

The LUT may be stored in non-volatile memory of OLM 100. Configuration-input (511) corresponding to the operating frequency range of f_frac (155) and to the range of integer-component (105) corresponding to desired fraction is provided to current source 510 in a known way. For example, upon power-up of OLM 100, a first logic circuit of OLM 100 may determine the appropriate configuration-input value and store the value in a register, which in turn is read by a second logic circuit (e.g., contained in CC 450) of OLM 100 to configure CC 450. Alternatively, a user may determine value of configuration-input (511) by looking up LUT, and program a register with the appropriate configuration-input value via corresponding means.

Although the illustrative embodiment depicts a particular technique of determining and configuring the magnitude of I-ref (447), alternative embodiments may employ different techniques, as will be apparent to a skilled practitioner by reading the disclosure herein. For example, simulations of input buffer (475) may be performed for all supported values of integer-component (105) instead of range-based approach noted above.

The description is continued to illustrate the manner in which DAC 450 reduces non-linearity in DTC 150 in accordance with aspects of the present disclosure.

7. Reducing Non-Linearity in DTC

Figure 6:
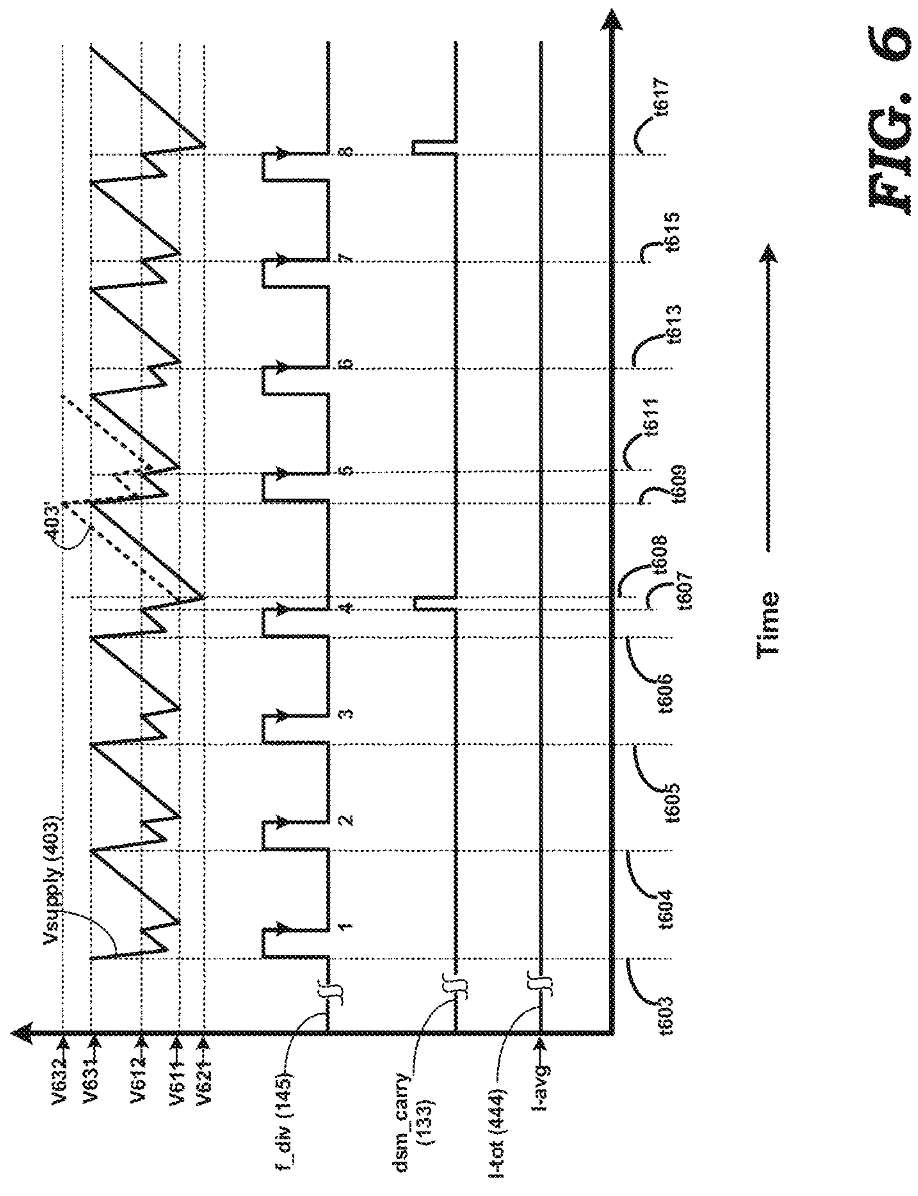
FIG. 6 is a timing diagram (not to scale) illustrating the reduction in ripple in power supply voltage, in an embodiment of the present disclosure.

FIG. 6 is a timing diagram (not to scale) illustrating reduction in ripple in power supply voltage in steady-state operation of DTC 150 in an embodiment of the present disclosure, and depicts waveforms/values Vsupply (403), Ndiv1 (132), f_div (145), I-tot (444) and dsm_carry (133) for the example fraction of 4.25 noted above. Clock periods of f_div (145) are shown numbered 1 to 8 for ease of understanding. Thus, clock period 1 is shown starting at t603 and ending at t604, and so on. Although the illustrative embodiment depicts DTC 150 as delaying falling edges of clock f_div (145), aspects of the present disclosure are equally applicable to DTCs delaying rising edges, as will be apparent to a skilled practitioner by reading the disclosure herein.

At time t607, dsm_carry bit (133) is asserted when code value Ndiv1 on path 132 changes from lower value (4) to higher value (5). CC 450 draws (sinks) current of magnitude I-ref (447) starting at time t607, thus discharging decoupling capacitor 412 to voltage of magnitude V621, such that for the next (rising) edge transition of clock f_div (345) occurring at t609, Vsupply (403) is restored to magnitude V631, which is substantially equal to magnitude (V631) in previous period (t605-t606).

It is noted herein that although waveform I-tot (444), representing average current drawn from LDO 420 across lower and higher periods of f_div (145), is shown as straight line for ease of illustration, it is understood that, in practice, a non-zero difference between average currents drawn for lower and higher periods may still exist, although such difference is minimized as compared to difference (I-avg−1 minus I-avg−2 of FIG. 3C) indicated for prior art. Such non-zero difference may depend on factors such as bandwidth of LDO 420, operating frequency range of f_frac (155), fraction being realized, etc.

Accordingly, the magnitude of supply voltage Vsupply (403) available for inverters in input buffer 475 at occurrences of falling edges (t611, t613, t615 and t617) remains substantially same in each clock period of f_div (145).

If CC 450 had not drawn extra current I-ref (447) in the period t607-t608, decoupling capacitor 412 would have charged to magnitude V632 (as shown by dotted waveform 403'), thus contributing to non-linearity of DTC 450.

Since there is no (or very little) difference in magnitude of Vsupply (403) for processing edge transitions by input buffer 475 across lower and higher periods of f_div (345), propagation delays introduced by input buffer 475 are substantially the same, thus improving linearity of DTC 150.

Although the illustrative embodiment illustrates single-stage input buffer 475, aspects of the present disclosure are equally applicable when multiple stages of input buffers are employed, as will be apparent to a skilled practitioner upon reading the disclosure herein.

In addition to employing CC 450, in an embodiment, the capacitance value of decoupling capacitor (412) is selected to be as large as practically possible, i.e., within area constraints specified for the chip. For example, decoupling capacitor (412) may have a capacitance value range of 20-40 pico-Farads to partly reduce the non-linearity caused due to ripple in Vsupply (403) for an OLM configured to operate at fref clock frequency range of 200-1400 Mega-Hertz.

In this manner, aspects of the present disclosure reduce non-linearity in a DTC when an input clock changes between lower and higher periods. DTC 150 implemented as described above can be incorporated in a larger device or system as described briefly next.

8. System

Figure 7:
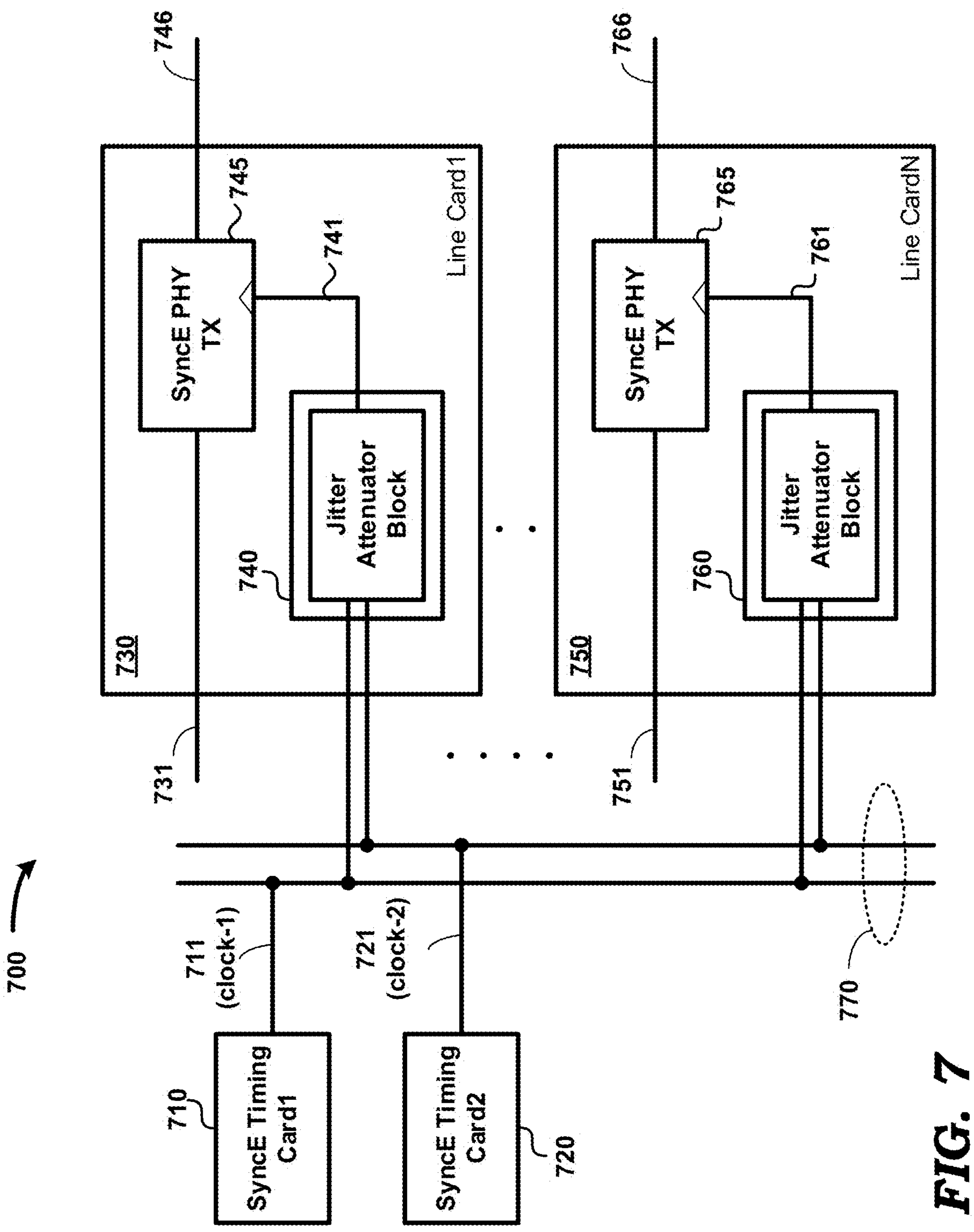
FIG. 7 is a block diagram of a system in which a device implemented according to several aspects of the present disclosure can be incorporated, in an embodiment of the present disclosure.

FIG. 7 is a block diagram of an example system containing a PLL implemented according to various aspects of the present disclosure, as described in detail above. System 700 is shown containing SyncE (Synchronous Ethernet) timing cards (710 and 720) and line cards 1 through N, of which only two line cards 730 and 750 are shown for simplicity. Line card 730 is shown containing jitter attenuator block 740 and SyncE PHY Transmitter 745. Line card 750 is shown containing jitter attenuator block 760 and SyncE PHY Transmitter 765. The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 710 or 720). Accordingly, Ethernet packets are re-timed with respect to the master clock, and then transmitted in the physical layer. Thus, data packets (e.g., on path 731 and 751) are re-timed and transmitted without any time stamp information being recorded in the data packet. The packets may be generated by corresponding applications such as IPTV (Internet Protocol Television), VoIP (Voice over Internet Protocol), etc.

Thus, line card 730 receives a packet on path 731, and forwards the packet on output 746 after the packet has been re-timed (synchronized) with a master clock. Similarly, line card 750 receives a packet on path 751, and forwards the packet on output 766 after the packet has been re-timed (synchronized) with a master clock.

The master clock (711/clock 1) is generated by timing card 710. Timing card 720 generates a redundant clock (721/clock-2) that is to be used by line cards 730 and 750 upon failure of master clock 711. Master clock 711 and redundant clock 721 are provided via a backplane (represented by numeral 770) to each of lines cards 730 and 750.

In line card 730, jitter attenuator block 740 contains PLL 110 and OLM 100 (of FIG. 1), described above in detail, and receives clocks 711 and 721. PLL 740 generates an output clock 741 which is used to synchronize (re-time) packets received on path 731 and forwarded as re-timed packets on path 746.

Similarly, in line card 750, jitter attenuator block 760 also contains PLL 110 and OLM 100 (of FIG. 1), described above in detail, and receives clocks 711 and 721. PLL 760 generates an output clock 761 which is used to synchronize (re-time) packets received on path 751 and forwarded as re-timed packets on path 766.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4, 5 and 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An open-loop modulator (OLM) circuit for generating a fractional output clock having a frequency which is a desired fraction of that of a reference clock, wherein said desired fraction comprises an integer component and a fractional component, said OLM comprising:

a delta-sigma modulator (DSM) coupled to receive said desired fraction and to generate a sequence of first codes and a corresponding sequence of second codes, wherein said sequence of first codes comprises a set of a lower value and a set of a higher value together representing said desired fraction on average;

a first divider coupled to receive said reference clock and each first code of said sequence of first codes, and to generate a divided signal having a period that is a multiple of the period of said reference clock, wherein the multiple is said each first code, such that said divided signal has different periods corresponding to said lower value and said higher value;

a digital-to-time converter (DTC) coupled to generate said fractional output clock from said divided signal, wherein said DTC comprises:

an input buffer, powered by a power supply, coupled to receive said divided signal and to generate an intermediate output, wherein the current drawn from said power supply comprises a first average current magnitude when said first code comprises said lower value, and a second average current magnitude when said first code comprises a higher value;

a delay generator coupled to receive said intermediate output and to delay said intermediate output according to corresponding second code of said sequence of second codes to generate said fractional output clock; and a correction-component, coupled to draw current from said power supply, to compensate for the difference between said first average current magnitude and said second average current magnitude to improve linearity of said DTC.

2. The OLM circuit of claim 1, wherein said DSM is designed to indicate occurrences of said higher value for said first code using a bit at a specified logic level, wherein said correction-component draws a first current from said power supply when said bit equals said specified logic level to compensate for said difference between said first average current magnitude and said second average current magnitude.

3. The OLM circuit of claim 2, wherein said correction-component comprises a digital-to-analog converter (DAC) to draw said first current from said power supply.

4. The OLM circuit of claim 2, wherein said DSM is a first-order delta-sigma modulator.

5. The OLM circuit of claim 3, wherein magnitude of said first current is configured such that the average current drawn from said power supply remains substantially equal across said lower and said higher periods of said divided signal.

6. The OLM circuit of claim 3, wherein said DAC comprises:

a first transistor;

a second transistor;

a third transistor;

a controlled current source; and a logic circuit, wherein said first transistor and said second transistor are coupled in current-mirror configuration, wherein said controlled current source is coupled between a bias-voltage and a first current terminal of said first transistor, wherein said third transistor is coupled between said power supply and a first current terminal of said second transistor, wherein a control terminal of said third transistor is coupled to receive said bit, wherein said controlled current source is configured to source said first current so as to substantially render equal the magnitude of average currents drawn from said power supply in said lower and said higher periods of said divided signal, wherein a magnitude of said first current is configured based on a configuration-input.

7. The OLM circuit of claim 6, further comprising a look-up table containing corresponding values of configuration-input for each combination of a respective operating frequency range of said fractional output clock and a respective range of values of said integer component supported by said OLM circuit, wherein said logic circuit determines said configuration-input based on said look-up table.

8. A digital-to-time converter (DTC) for generating a fractional output clock from a divided signal based on a sequence of delay-codes, said DTC comprising:

an input buffer, powered by a power supply, coupled to receive said divided signal and to generate an intermediate output, wherein said divided signal has a lower period and a higher period, wherein the current drawn from said power supply comprises a first average current magnitude when the period of said first divided signal equals said lower period, and a second average current magnitude when the period of said divided signal equals said higher period;

a delay generator coupled to receive said intermediate output and to delay a corresponding edge of said intermediate output according to each delay-code of said sequence of delay-codes to generate said fractional output clock; and a correction-component, coupled to draw current from said power supply, to compensate for the difference between said first average current magnitude and said second average current magnitude to improve linearity of said DTC.

9. The DTC of claim 8, wherein said DTC receives a bit at a specified logic level indicating occurrences of said higher period, wherein said correction-component draws a first current from said power supply when said bit equals said specified logic level to compensate for said difference between said first average current magnitude and said second average current magnitude.

10. The DTC of claim 9, wherein said correction-component comprises a digital-to-analog converter (DAC) to draw said first current from said power supply.

11. The DTC of claim 10, wherein magnitude of said first current is configured such that the average current drawn from said power supply remains substantially equal across said lower and said higher periods of said divided signal.

12. The DTC of claim 11, wherein said DAC comprises:

a first transistor;

a second transistor;

a third transistor;

a controlled current source; and a logic circuit, wherein said first transistor and said second transistor are coupled in current-mirror configuration, wherein said controlled current source is coupled between a bias-voltage and a first current terminal of said first transistor, wherein said third transistor is coupled between said power supply and a first current terminal of said second transistor, wherein a control terminal of said third transistor is coupled to receive said bit, wherein said controlled current source is configured to source said first current so as to substantially render equal the magnitude of average currents drawn from said power supply in said lower and said higher periods of said divided signal.

13. The DTC of claim 12, wherein a magnitude of said first current is configured based on a configuration-input.

14. The DTC of claim 13, further comprising a look-up table containing corresponding values of configuration-input for each combination of a respective operating frequency range of said fractional output clock and a respective range of values of said integer component supported by said OLM circuit, wherein said logic circuit determines said configuration-input based on said look-up table.

15. A system comprising:

a line card coupled to receive a data packet, said line card to re-time said data packet with reference to a selected clock, and to transmit a re-timed packet;

a first timing card to generate a first clock; and a power supply, wherein said line card comprises:

a phase-locked loop (PLL) coupled to receive said first clock, said PLL to generate a reference clock locked to said first clock; and an open-loop-modulator (OLM) coupled to receive said reference clock and to generate a fractional output clock having a frequency which is a desired fraction of that of said reference clock, wherein said OLM comprises:

a delta-sigma modulator (DSM) coupled to receive said desired fraction and to generate a sequence of first codes and a corresponding sequence of second codes, wherein said sequence of first codes comprises a set of a lower value and a set of a higher value together representing said desired fraction on average;

a first divider coupled to receive said reference clock and each first code of said sequence of first codes, and to generate a divided signal having a period that is a multiple of the period of said reference clock, wherein the multiple is said each first code, such that said divided signal has different periods corresponding to said lower value and said higher value;

a digital-to-time converter (DTC) coupled to generate said fractional output clock from said divided signal, wherein said DTC comprises:

an input buffer, powered by said power supply, coupled to receive said divided signal and to generate an intermediate output, wherein the current drawn from said power supply comprises a first average current magnitude when said first code comprises said lower value, and a second average current magnitude when said first code comprises a higher value;

a delay generator coupled to receive said intermediate output and to delay said intermediate output according to corresponding second code of said sequence of second codes to generate said fractional output clock; and a correction-component, coupled to draw current from said power supply, to compensate for the difference between said first average current magnitude and said second average current magnitude to improve linearity of said DTC.

16. The system of claim 15, wherein said DSM is designed to indicate occurrences of said higher value for said first code using a bit at a specified logic level, wherein said correction-component draws a first current from said power supply when said bit equals said specified logic level to compensate for said difference between said first average current magnitude and said second average current magnitude.

17. The system of claim 16, wherein said correction-component comprises a digital-to-analog converter (DAC) to draw said first current from said power supply.

18. The system of claim 16, wherein said DSM is a first-order delta-sigma modulator.

19. The system of claim 17, wherein magnitude of said first current is configured such that the average current drawn from said power supply remains substantially equal across said lower and said higher periods of said divided signal.

20. The system of claim 17, wherein said DAC comprises:

a first transistor;

a second transistor;

a third transistor; and a controlled current source, wherein said first transistor and said second transistor are coupled in current-mirror configuration, wherein said controlled current source is coupled between a bias-voltage and a first current terminal of said first transistor, wherein said third transistor is coupled between said power supply and a first current terminal of said second transistor, wherein a control terminal of said third transistor is coupled to receive said bit, wherein said controlled current source is configured to source a current of magnitude so as to substantially render equal the magnitude of average currents drawn from said power supply in said lower and said higher periods of said divided signal.

* * * * *